United States Patent
Isohata

(10) Patent No.: US 9,941,839 B2
(45) Date of Patent: Apr. 10, 2018

(54) ELECTRONIC COMPONENT, ELECTRONIC APPARATUS, AND MOVING OBJECT

(71) Applicant: SEIKO EPSON CORPORATION, Tokyo (JP)

(72) Inventor: Kensaku Isohata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/421,851

(22) Filed: Feb. 1, 2017

(65) Prior Publication Data

US 2017/0149384 A1 May 25, 2017

Related U.S. Application Data

(63) Continuation of application No. 15/006,730, filed on Jan. 26, 2016, now Pat. No. 9,595,914, which is a continuation of application No. 14/573,349, filed on Dec. 17, 2014, now Pat. No. 9,276,555.

(30) Foreign Application Priority Data

Dec. 24, 2013 (JP) ................................. 2013-265011

(51) Int. Cl.
*H03B 5/04* (2006.01)
*H03B 5/32* (2006.01)

(52) U.S. Cl.
CPC ................. *H03B 5/04* (2013.01); *H03B 5/32* (2013.01); *H03B 2200/0018* (2013.01)

(58) Field of Classification Search
CPC ........................................................ H03L 1/02
See application file for complete search history.

(56) References Cited

U.S. PATENT DOCUMENTS

| | | | |
|---|---|---|---|
| 4,443,732 A | 4/1984 | Hayashi | |
| 6,060,692 A | 5/2000 | Bartley et al. | |
| 7,514,852 B2 | 4/2009 | Kasahara et al. | |
| 8,049,572 B2 | 11/2011 | Arai et al. | |
| 9,276,555 B2* | 3/2016 | Isohata | H03H 9/02102 |
| 2001/0045320 A1 | 11/2001 | Sugiyama et al. | |
| 2010/0289589 A1 | 11/2010 | Ito et al. | |
| 2011/0156229 A1* | 6/2011 | Shinohara | H01L 23/49531 257/676 |
| 2012/0235761 A1 | 9/2012 | Mitome et al. | |
| 2013/0293312 A1* | 11/2013 | Yorita | H03L 1/02 331/70 |
| 2016/0142010 A1* | 5/2016 | Isohata | H03H 9/02102 331/70 |

FOREIGN PATENT DOCUMENTS

| | | |
|---|---|---|
| JP | S52-012447 U | 1/1977 |
| JP | H01-240880 A | 9/1989 |

(Continued)

*Primary Examiner* — Jeffrey Shin
(74) *Attorney, Agent, or Firm* — Oliff PLC

(57) ABSTRACT

An electronic component includes a wiring substrate, a heating element, a first support, a second support, and a container. The heating element, the first support, and the second support are electrically connected to the wiring substrate. Each of the first support and the second support includes a protrusion portion, and the protrusion portion of the second support is shorter than the protrusion portion of the first support.

20 Claims, 6 Drawing Sheets

(56) References Cited

FOREIGN PATENT DOCUMENTS

| JP | H07-50523 A | 2/1995 |
| JP | 2007-006270 A | 1/2007 |
| JP | 2009-200817 A | 9/2009 |
| JP | 2010-154400 A | 7/2010 |
| JP | 2013-051730 A | 3/2013 |

\* cited by examiner

ELECTRONIC COMPONENT, ELECTRONIC APPARATUS, AND MOVING OBJECT

This application is a continuation application of U.S. patent application Ser. No. 15/006,730, filed Jan. 26, 2016, which is a continuation of U.S. patent application Ser. No. 14/573,349, filed Dec. 17, 2014, which claims priority to JP 2013-265011, filed on Dec. 24, 2013. The disclosures of each of these applications are hereby incorporated by reference in their entireties.

BACKGROUND

1. Technical Field

The present invention relates to an electronic component, an electronic apparatus, and a moving object.

2. Related Art

Hitherto, electronic components including a resonation device such as a quartz crystal resonator have been required to be further reduced in size and thickness with the miniaturization and thinning of electronic apparatuses, and power consumption has also been required to be reduced in order to achieve energy saving. Particularly, in an electronic component such as a crystal oscillator with a thermostat (OCXO) having a structure in which a constant ambient temperature of a quartz crystal resonator is maintained by heating the quartz crystal resonator and the vicinity thereof by a heating element in order to avoid the influence of the ambient temperature to thereby have a high frequency stability, heat from the heating element disposed on, for example, a substrate is not uniformly transferred to the entire substrate on which the quartz crystal resonator and an oscillation component in the vicinity of the quartz crystal resonator are disposed. For this reason, it is difficult to control the temperature of the oscillation component disposed in the vicinity of the quartz crystal resonator, and thus there is a problem in that a high frequency stability cannot be obtained.

In order to solve such a problem, JP-A-2007-6270 discloses a method of increasing frequency stability by providing a heat-conducting plate on a substrate and transferring heat of a heating element to the entire substrate.

However, in the above-mentioned OCXO, lead terminals are connected to the substrate on which the quartz crystal resonator and the heating element are disposed, and the lead terminals are extracted to the outside of a package. Thus, when some of the lead terminals are used as lead terminals for adjustment or inspection, if the length of the lead terminal for adjustment or inspection is set to be equal to the length of a lead terminal connected to a mounting substrate on which the OCXO is mounted, there is a concern that the lead terminal for adjustment or inspection may come into contact with the mounting substrate. When the lead terminal for adjustment or inspection comes into contact with the mounting substrate, heat from the heating element is transferred to the mounting substrate and escapes. For this reason, the temperature stability of the quartz crystal resonator and the oscillation component are deteriorated, and thus there is the possibility of frequency stability being deteriorated.

SUMMARY

An advantage of some aspects of the invention is to solve at least a part of the problems described above, and the invention can be implemented in the following forms or application examples.

Application Example 1

An electronic component according to this application example includes a heating element; a container; a first support which penetrates the container, is mechanically connected to the container, and has a first protrusion portion protruding outside the container and a second support which penetrates the container, is mechanically connected to the container, and has a second protrusion portion protruding outside the container; and a wiring substrate which has the heating element, the first support, and the second support being electrically connected thereof and is disposed within the container through the first support and the second support. The second protrusion portion is shorter than the first protrusion portion.

According to this application example, the protrusion portion of the second support is shorter than the protrusion portion of the first support for connecting the electronic component on a mounting substrate. Thus, when the electronic component is mounted on the mounting substrate, it is possible to prevent the protrusion portion of the second support from coming into contact with the mounting substrate. Therefore, it is possible to reduce the outflow of heat of the heating element to the mounting substrate along the protrusion portion of the second support. For this reason, there is an effect that it is possible to reduce the radiation of heat of the heating element to the outside and to obtain the electronic component with a high frequency stability.

Application Example 2

This application example is directed to the electronic component according to the application example described above, wherein the container has a projection portion which protrudes in a protrusion direction of the second protrusion portion, is longer than the second protrusion portion, and is shorter than the first protrusion portion.

According to this application example, a projection portion longer than the second protrusion portion and shorter than the first protrusion portion is provided, so that the projection portion serves as a stopper when mounting the electronic component on the mounting substrate, and thereby the second protrusion portion and the mounting substrate are prevented from coming into contact with each other. Thus, there is an effect that it is possible to reduce the radiation of heat of the heating element to the outside and to obtain the electronic component with a high frequency stability.

Application Example 3

This application example is directed to the electronic component according to the application example described above, wherein a thickness of the second support is smaller than a thickness of the first support.

According to this application example, the second support has a thickness smaller than that of the first support, and thus may have a reduced heat conduction as compared with the first support, thereby allowing heat emission from the second support close to the heating element to be further reduced. For this reason, there is an effect that it is possible to reduce the radiation of heat of the heating element to the outside and to obtain the electronic component with a high frequency stability.

Application Example 4

This application example is directed to the electronic component according to the application example described above, wherein the second protrusion portion has a supporting portion and an end, and a thickness of the end is larger than that of the supporting portion.

According to this application example, the end of the second protrusion portion has a thickness larger than that of the supporting portion. Accordingly, when the second support is used as a lead terminal for adjustment or inspection, there is a tendency for a probe for adjustment or inspection to come into contact with the second support. For this reason, it is possible to prevent an adjustment or inspection error from occurring due to contact failure with the probe, and thus there is an effect that it is possible to obtain the electronic component with higher accuracy.

Application Example 5

This application example is directed to the electronic component according to the application example described above, wherein the first support and the second support are connected to the container through an insulating member.

According to this application example, in a portion in which the first support and the second support penetrate the container, the first support, the second support, and the container are connected to each other through an insulating member such as glass having a low heat conductivity, and thus it is possible to reduce the radiation of heat of the heating element to the container along the first support and the second support. For this reason, there is an effect that it is possible to obtain the electronic component with a high frequency stability.

Application Example 6

This application example is directed to the electronic component according to the application example, wherein the electronic component further includes a circuit component, and the circuit component is electrically connected to the wiring substrate and includes an oscillation circuit and a resonator element.

According to this application example, the circuit component heated by the heating element includes the oscillation circuit and the resonator element. For this reason, heat of the heating element is sufficiently transferred to the oscillation circuit and the resonator element, and thus there is an effect that it is possible to obtain the electronic component with a high frequency stability.

Application Example 7

This application example is directed to the electronic component according to the application example described above, wherein the oscillation circuit, the resonator element, and the heating element are disposed within a second container, and the second container is disposed on the wiring substrate.

According to this application example, when the oscillation circuit, the resonator element, and the heating element are disposed within the second container, heat of the heating element is efficiently transferred to the oscillation circuit and the resonator element. Thus, there is an effect that it is possible to obtain the electronic component with higher accuracy.

Application Example 8

An electronic apparatus according to this application example includes the electronic component according to the application example described above.

According to this application example, there is an effect that it is possible to reduce the outflow of heat of the heating element to the outside and to obtain the electronic apparatus including an electronic component with a high frequency stability.

Application Example 9

An electronic apparatus according to this application example includes the electronic component according to the application example described above and a mounting substrate on which the electronic component is disposed. The first support and the mounting substrate are connected to each other, and the second support and the mounting substrate are separated from each other.

According to this application example, it is possible to reduce the outflow of heat of the heating element disposed in the electronic component to the mounting substrate along the protrusion portion of the second support. For this reason, there is an effect that it is possible to reduce the radiation of heat of the heating element to the outside and to obtain the electronic apparatus including an electronic component with a high frequency stability.

Application Example 10

A moving object according to this application example includes the electronic component according to the application example described above.

According to this application example, there is an effect that it is possible to reduce the outflow of heat of the heating element to the outside and to obtain the moving object including an electronic component with a high frequency stability.

BRIEF DESCRIPTION OF THE DRAWINGS

The invention will be described with reference to the accompanying drawings, wherein like numbers reference like elements.

FIG. 1A is a plan view and FIG. 1B is a cross-sectional view taken along line A-A of FIG. 1A.

FIG. 3A is a plan view and FIG. 3B is a cross-sectional view taken along line B-B of FIG. 3A.

FIG. 4A is a perspective view showing the configuration of a mobile (or notebook) personal computer and FIG. 4B is a perspective view showing the configuration of a mobile phone (PHS is also included).

DESCRIPTION OF EXEMPLARY EMBODIMENTS

Hereinafter, embodiments of the invention will be described in detail with reference to the accompanying drawings.

Electronic Component
First Embodiment

An example of an electronic component 1 according to a first embodiment of the invention includes a crystal oscillator with a thermostat (OCXO), and a description will be given with reference to FIGS. 1A and 1B.

Figure 1A:
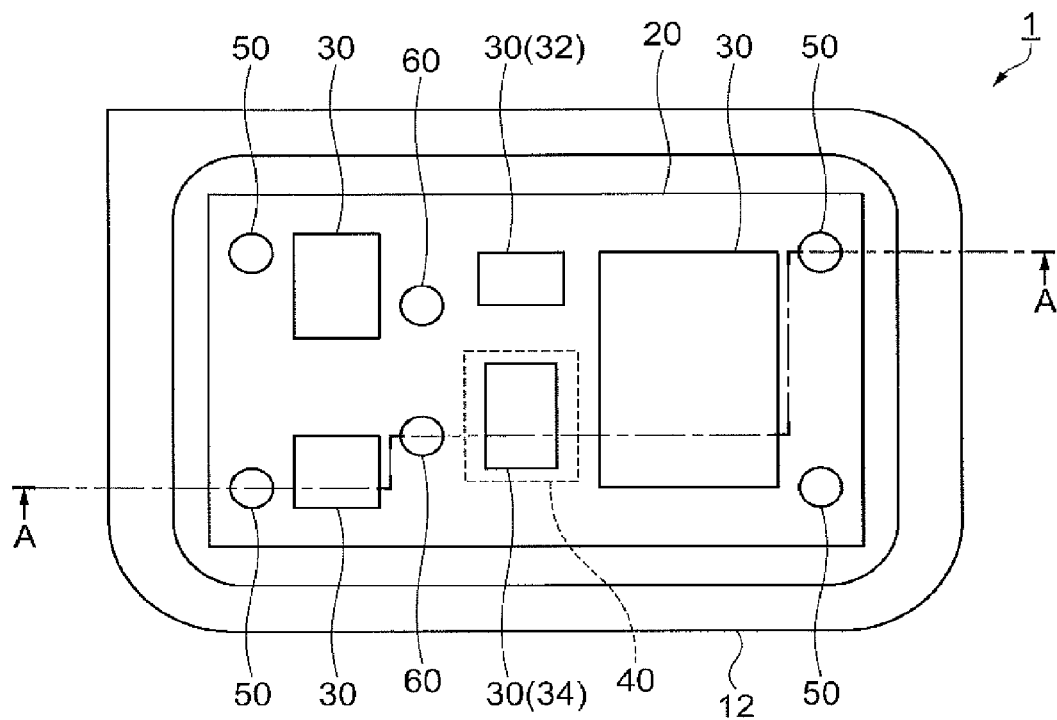
FIGS. 1A and 1B are schematic configuration diagrams of an electronic component according to a first embodiment of the invention.
Figure 1B:
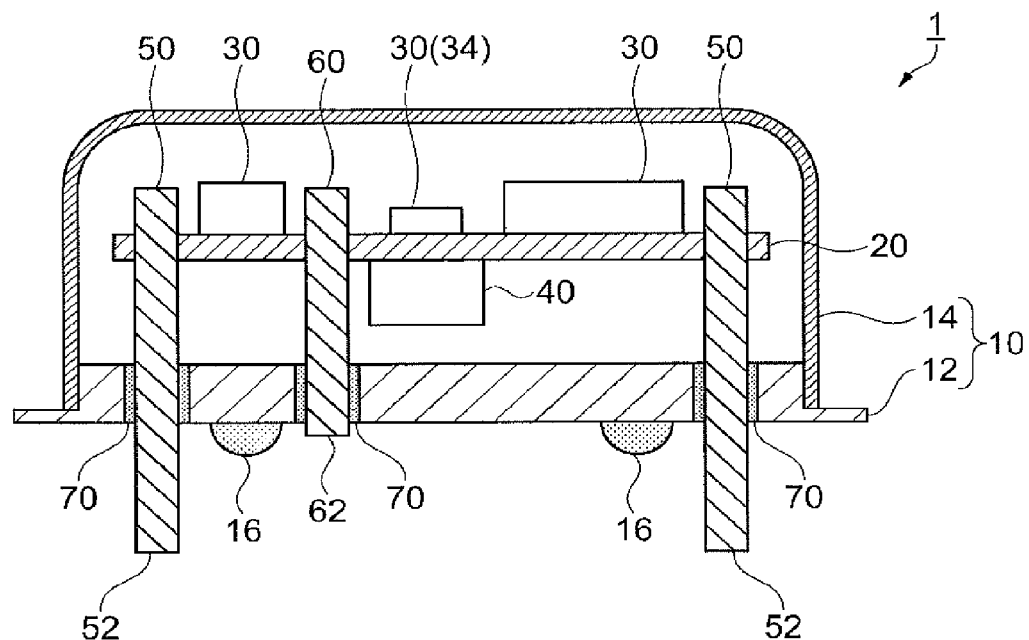

FIGS. 1A and 1B are schematic diagrams showing the configuration of the electronic component 1 according to the first embodiment of the invention. FIG. 1A is a plan view, and FIG. 1B is a cross-sectional view taken along line A-A shown in FIG. 1A. Meanwhile, FIG. 1A shows a state where a cover 14 is removed, for convenience of description of the internal configuration of the electronic component 1.

As shown in FIGS. 1A and 1B, the electronic component 1 is configured to include a wiring substrate 20 on which a circuit component 30 is disposed, the circuit component 30 including an oscillation circuit 32 and a resonator element 34, a heating element 40, such as a power transistor or a resistance heating element, which heats the circuit component 30, a first support 50 and a second support 60 which are electrically connected to the circuit component 30 through a wiring, and a container 10 including a base 12 and a cover 14. Meanwhile, the inside of the container 10 is airtightly sealed with a decompressed atmosphere such as a vacuum, or an inert gas atmosphere such as nitrogen, argon, or helium.

A wiring pattern (not shown) is formed on principal planes of two sides of the wiring substrate 20. The circuit component 30 including the oscillation circuit 32 and the resonator element 34 such as an SC cut quartz crystal piece and the heating element 40 such as a power transistor or a resistance heating element are disposed on the principal planes. In the wiring substrate 20, the first support 50, serving as a lead terminal, which is connected to a mounting substrate (not shown) having the electronic component 1 mounted thereon and the second support 60 serving as a lead terminal for adjustment or inspection are connected to a wiring using a conductive bonding member such as solder or a conductive adhesive. In addition, the wiring substrate 20 having the circuit component 30 and the heating element 40 disposed thereon is made to be separated from the base 12 of the container 10 by the first support 50 and the second support 60 so that heat of the heating element 40 is prevented from being directly radiated to the container 10. Meanwhile, in this embodiment, the resonator element 34 such as an SC cut quartz crystal resonator element is used as the circuit component 30, but the invention is not limited thereto. For example, it is also possible to use a resonator in which the resonator element 34 is airtightly sealed within a container in a decompressed atmosphere such as a vacuum or an inert gas atmosphere such as nitrogen, argon, or helium. Meanwhile, the circuit component 30 includes a control circuit for controlling the heating element 40 or the oscillation circuit 32 and a memory circuit. The second support 60 is used as a terminal for supplying data for adjusting the control circuit to the memory circuit or is used as a terminal for inspecting the control circuit that outputs data from the memory circuit.

The first support 50 and the second support 60 include a protrusion portion 52 and a protrusion portion 62, respectively, which protrude on a surface opposite to the surface of the base 12 on which the wiring substrate 20 is disposed. The protrusion portion 62 of the second support 60 is shorter than the protrusion portion 52 of the first support 50. For this reason, when the electronic component 1 is mounted on the mounting substrate, it is possible to prevent the protrusion portion 62 of the second support 60 from coming into contact with the mounting substrate. Thus, it is possible to reduce the outflow of heat of the heating element 40 to the mounting substrate along the protrusion portion 62 of the second support 60 and to reduce the radiation of heat of the heating element to the outside, thereby allowing the electronic component 1 with a high frequency stability to be obtained.

The base 12 of the container 10 is provided with a plurality of projection portions 16 on a surface opposite to the surface of the base 12 on which the wiring substrate 20 is disposed, the projection portion being longer than the protrusion portion 62 of the second support 60 in a direction in which the protrusion portion 62 of the second support 60 protrudes. For this reason, when the electronic component 1 is mounted on the mounting substrate, the projection portion 16 serving as a stopper can prevent the protrusion portion 62 of the second support 60 and the mounting substrate from coming into contact with each other. Thus, it is possible to reduce the radiation of heat of the heating element 40 to the outside, thereby allowing the electronic component 1 having a high frequency stability to be obtained. Meanwhile, a constituent material of the projection portion 16 is not particularly limited, but it is also possible to further reduce the radiation of heat of the heating element 40 to the outside along the container 10 by using a constituent material having a low heat conductivity, for example, an insulating material such as glass or a resin, or a material mixed with glass and a resin.

In addition, the base 12 is provided with penetrating portions (holes). The first support 50 and the second support 60 are inserted into the portions and are connected (hermetic seal) to the base through an insulating member 70 such as a resin or glass having a low heat conductivity. For this reason, the first support 50, the second support 60, and the container 10 are connected to each other by the insulating member 70 such as a resin or glass having a low heat conductivity, and thus it is possible to reduce the radiation of heat of the heating element 40 to the container 10 along the first support 50 and the second support 60. For this reason, it is possible to obtain the electronic component 1 with a high frequency stability.

Meanwhile, in the above-described embodiment, the first support 50 and the second support 60 having substantially the same thickness are shown and described. However, the second support 60 may be configured to have a smaller thickness than that of the first support 50. With such a configuration, the heat conduction can be reduced as compared with the first support 50, and thus it is possible to further reduce heat emission from the second support 60 which is disposed near the heating element 40. For this reason, it is possible to reduce the radiation of heat of the heating element 40 to the outside, thereby allowing the electronic component 1 with a high frequency stability to be obtained.

The constituent materials of the base 12 of the container 10, the cover 14, the first support 50, and the second support 60 are a metal, and an iron-based alloy having a low heat conductivity such as, for example, 42 alloy (iron-nickel alloy) subjected to nickel plating is suitable.

In addition, the wiring substrate 20 is formed of a material such as a glass epoxy resin or ceramics having an insulating property. In addition, the wiring provided in the wiring substrate 20 is formed by a method of etching a substrate of which the entire surface is coated with copper foil or a method of performing screen printing of a metal wiring material such as tungsten (W) or molybdenum (Mo) on a substrate, baking the material, and performing plating of nickel (Ni) or gold (Au) thereon.

Further, in the above-described embodiment, an SC cut quartz crystal piece is used as the resonator element 34. However, the invention is not limited thereto, and an AT cut quartz crystal piece may be used.

Second Embodiment

Next, an electronic component 1a according to a second embodiment of the invention will be described with reference to FIG. 2.

Figure 2:
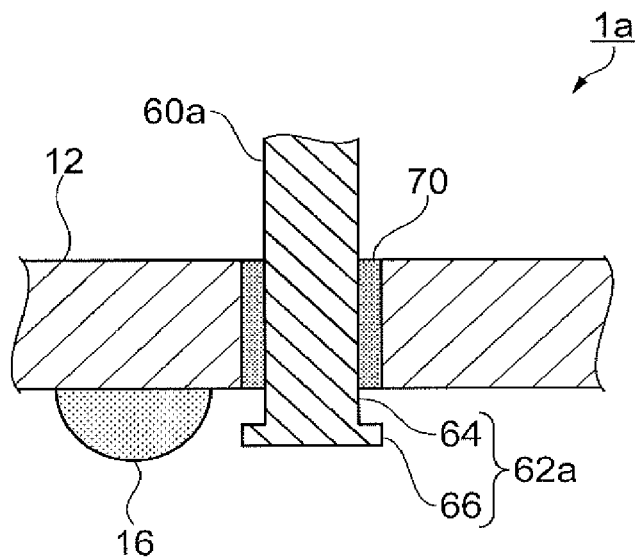
FIG. 2 is an enlarged cross-sectional view of the vicinity of a second support which is an electronic component according to a second embodiment of the invention.

FIG. 2 is a schematic configuration diagram of the electronic component 1a according to the second embodiment of the invention, and is an enlarged cross-sectional view of the vicinity of a second support 60a.

Hereinafter, in the second embodiment, a description will be given with a focus on the differences from the first embodiment mentioned above, and a description of the same matters will be omitted.

As shown in FIG. 2, the electronic component 1a according to the second embodiment is different from the electronic component 1 according to the first embodiment in that the protrusion portion 62 of the second support 60 has a fixed thickness, whereas a protrusion portion 62a of a second support 60a is constituted by a supporting portion 64 and an end 66 and that the end 66 is thicker than the supporting portion 64.

With such a configuration, when the second support 60a is used as a lead terminal for adjustment or inspection, there is a tendency for a probe for adjustment or inspection to come into contact with the second support. Thus, it is possible to prevent an adjustment or inspection error from occurring due to contact failure with the probe, thereby allowing the electronic component 1a with higher accuracy to be obtained. In addition, similarly to the first embodiment, when the electronic component 1a is mounted on a mounting substrate, the protrusion portion 62a of the second support 60a does not come into contact with the mounting substrate. Thus, even when the end 66 is thicker than the supporting portion 64 of the protrusion portion, it is possible to reduce the outflow of heat of a heating element 40 to the mounting substrate along the end 66 and to reduce the radiation of heat of the heating element to the outside, thereby allowing the electronic component 1a with a high frequency stability to be obtained.

Third Embodiment

Next, an electronic component 1b according to a third embodiment of the invention will be described with reference to FIGS. 3A and 3B.

Figure 3A:
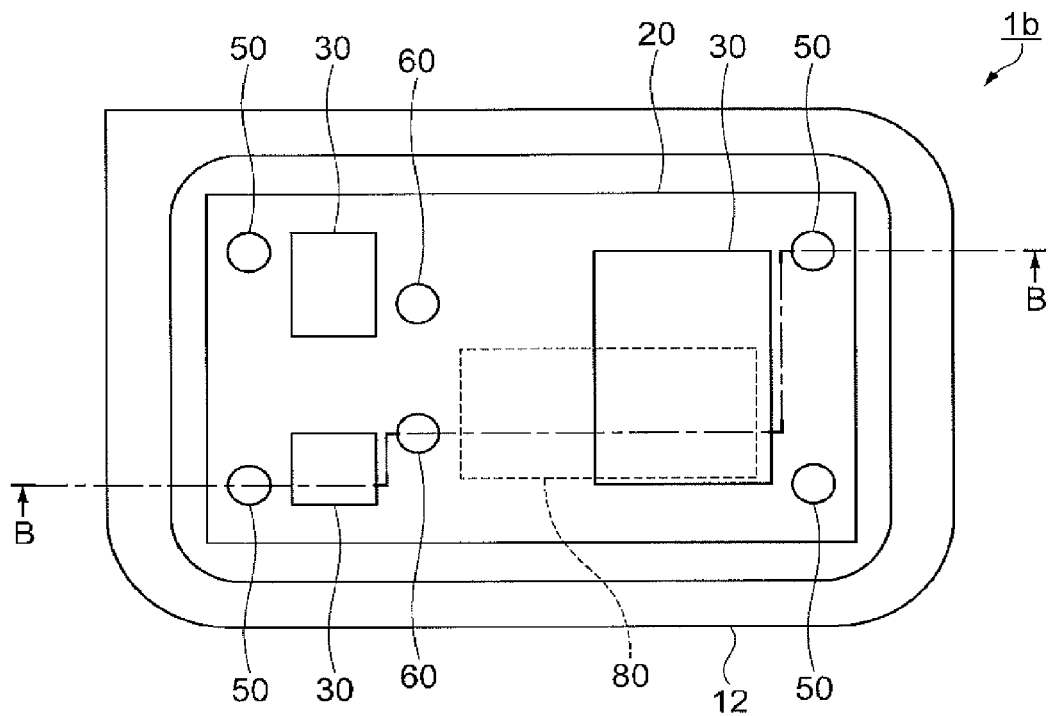
FIGS. 3A and 3B are schematic configuration diagrams of an electronic component according to a third embodiment of the invention.
Figure 3B:
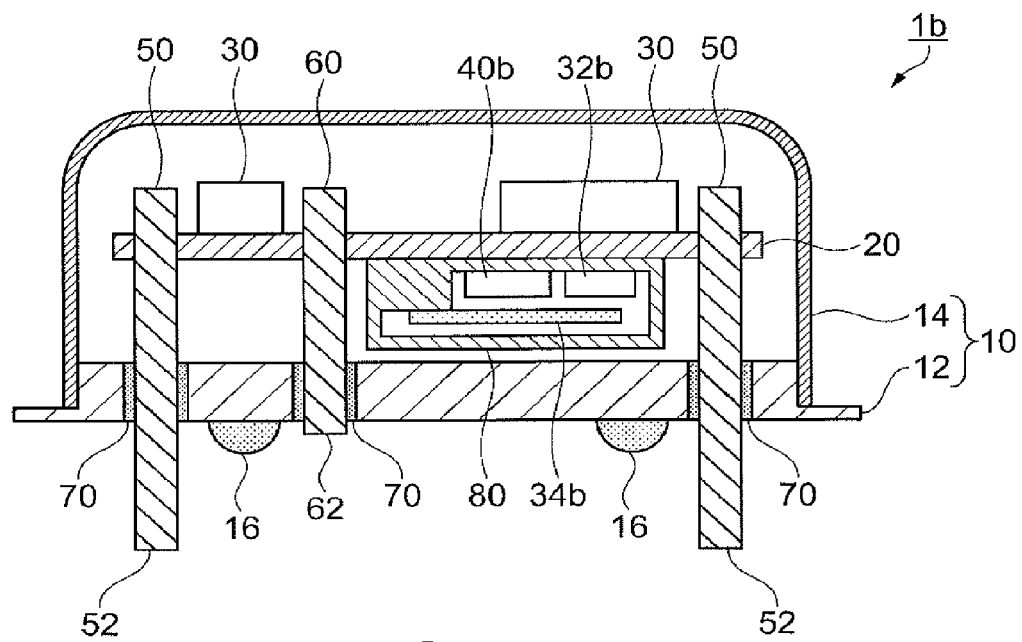

FIGS. 3A and 3B are schematic configuration diagrams of the electronic component 1b according to the third embodiment of the invention. FIG. 3A is a plan view, and FIG. 3B is a cross-sectional view taken along line B-B of FIG. 3A. Meanwhile, FIG. 3A shows a state where a cover 14 is removed, for convenience of description of the internal configuration of the electronic component 1b.

Hereinafter, the third embodiment will be described with a focus on the differences from the first embodiment mentioned above, and a description of the same matters will be omitted.

As shown in FIGS. 3A and 3B, the electronic component 1b according to the third embodiment is different from the electronic component 1 according to the first embodiment in that an oscillation circuit 32b, a resonator element 34b, and a heating element 40b disposed on principal planes of two sides of a wiring substrate 20 are accommodated in a second container 80 and are disposed on the wiring substrate 20.

With such a configuration, the oscillation circuit 32b and the resonator element 34b are disposed within the second container 80 together with a heating element 40b, and thus heat of the heating element 40b is efficiently transferred to the oscillation circuit 32b and the resonator element 34b, thereby allowing the electronic component 1b with higher accuracy to be obtained.

Electronic Apparatus

Subsequently, an electronic apparatus to which the electronic component 1, the electronic component 1a, or the electronic component 1b according to the embodiment of the invention is applied will be described with reference to FIGS. 4A and 4B and FIG. 5.

Figure 4A:
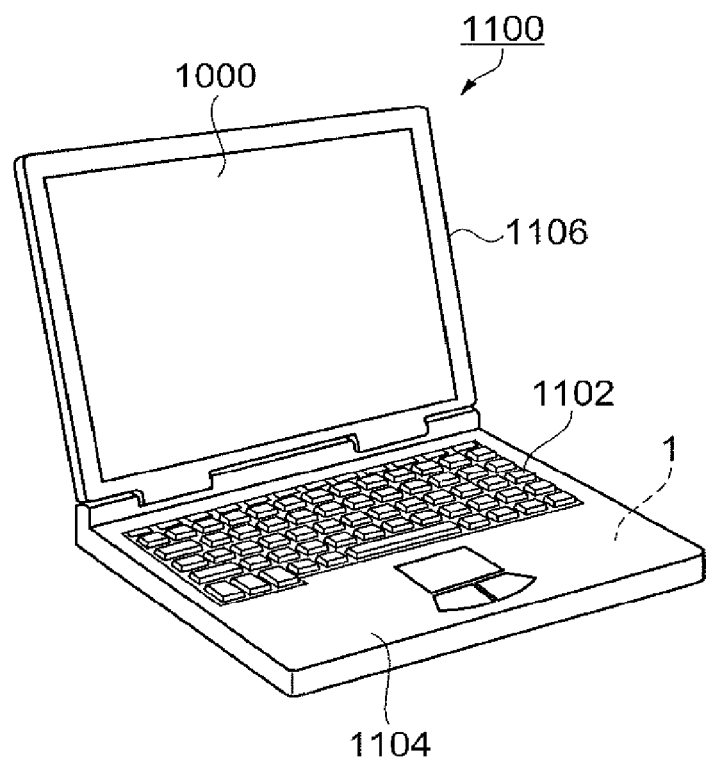
FIGS. 4A and 4B are schematic diagrams showing an electronic apparatus including the electronic component according to the invention.
Figure 4B:
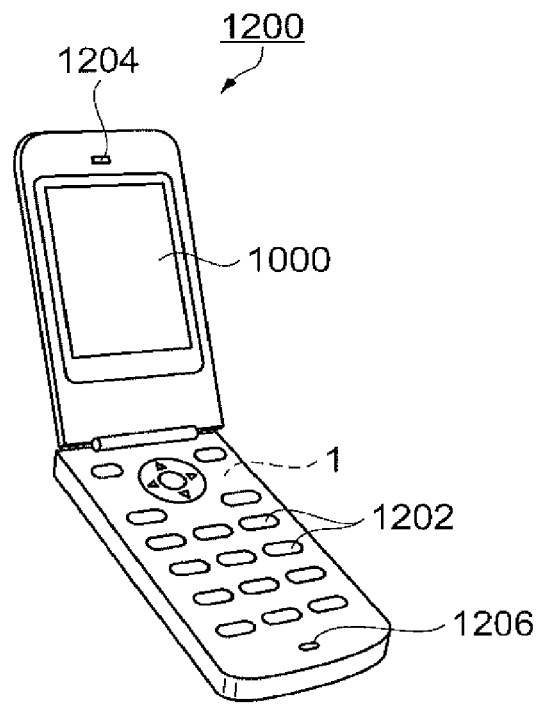

FIGS. 4A and 4B are schematic diagrams showing an electronic apparatus including the electronic component 1, the electronic component 1a, or the electronic component 1b according to the embodiment of the invention. FIG. 4A is a perspective view showing the configuration of a mobile (or notebook) personal computer 1100, and FIG. 4B is a perspective view showing the configuration of a mobile phone 1200 (PHS is also included).

In FIG. 4A, the personal computer 1100 is configured to include a main body 1104 having a keyboard 1102 and a display unit 1106 having a display portion 1000, and the display unit 1106 is supported so as to be rotatable with respect to the main body 1104 through a hinge structure. The electronic component 1 functioning as an oscillator is embedded in the personal computer 1100.

In FIG. 4B, the mobile phone 1200 includes a plurality of operation buttons 1202, an earpiece 1204, and a mouthpiece 1206, and the display portion 1000 is disposed between the operation buttons 1202 and the earpiece 1204. The electronic component 1, the electronic component 1a, or the electronic component 1b, which functions as an oscillator, is embedded in the mobile phone 1200.

Figure 5:
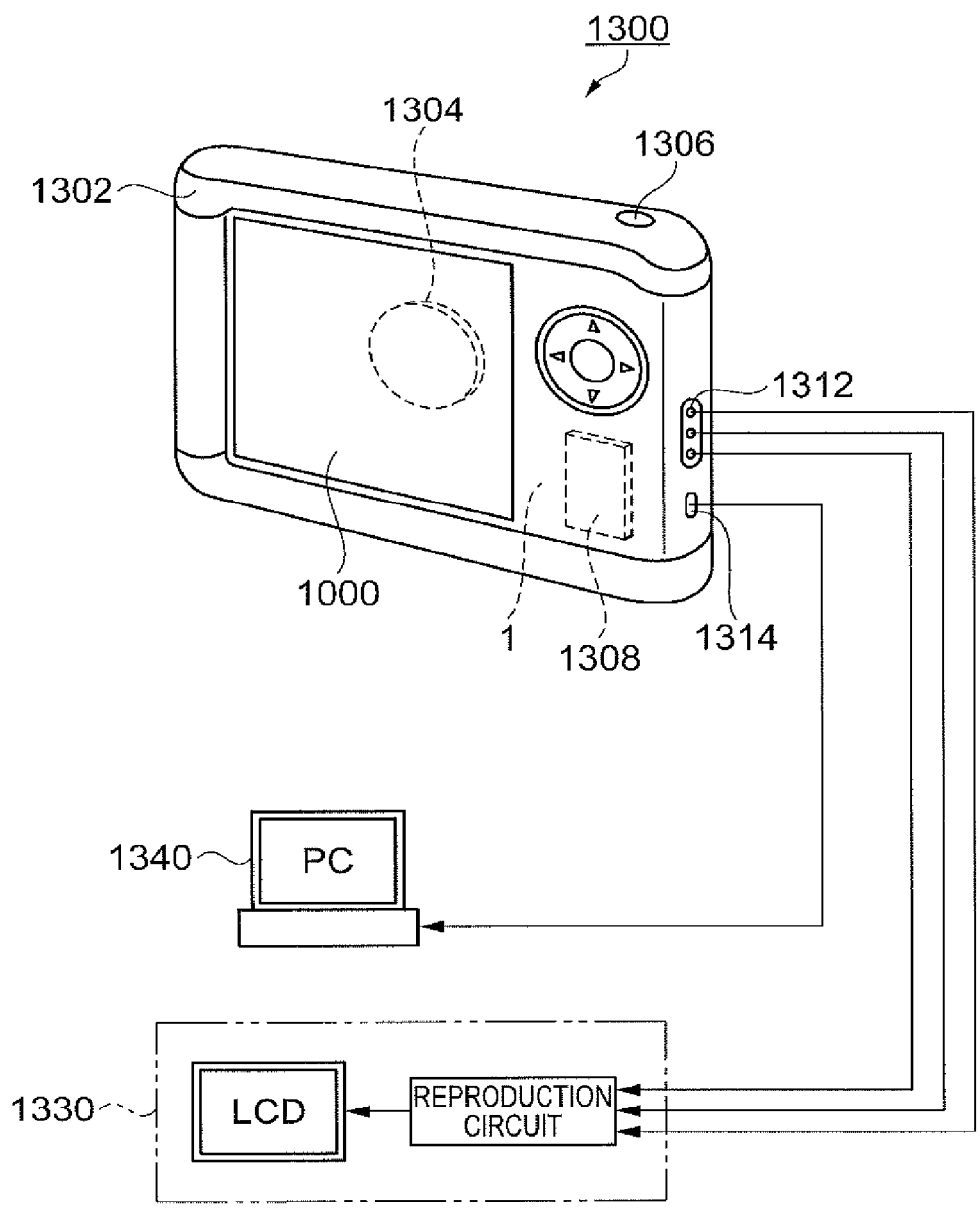
FIG. 5 is a perspective view showing the configuration of a digital camera as an electronic apparatus including the electronic component according to the invention.

FIG. 5 is a perspective view showing the configuration of a digital camera 1300 as an electronic apparatus including the electronic component 1, the electronic component 1a, or the electronic component 1b according to the embodiment of the invention. Meanwhile, connection with an external device is simply shown in FIG. 5.

The digital camera 1300 generates an imaging signal (image signal) by performing photoelectric conversion of an optical image of a subject using an imaging element, such as a charge coupled device (CCD).

The display portion 1000 is provided on the back of a case (body) 1302 in the digital camera 1300, so that display is performed on the basis of an imaging signal of the CCD. The display portion 1000 functions as a viewfinder that displays a subject as an electronic image. In addition, a light receiving unit 1304 including an optical lens (imaging optical system), a CCD, and the like is provided on the front side (back side in the drawing) of the case 1302.

When a photographer checks a subject image displayed on the display portion 1000 and presses a shutter button 1306, an imaging signal of the CCD at that point in time is transferred and stored in a memory 1308. In the digital camera 1300, a video signal output terminal 1312 and an input/output terminal for data communication 1314 are provided on the side surface of the case 1302. In addition, as shown in the drawing, a television monitor 1330 is connected to the video signal output terminal 1312 and a personal computer 1340 is connected to the input/output terminal for data communication 1314 when necessary. Further, an imaging signal stored in the memory 1308 may be output to the television monitor 1330 or the personal computer 1340 by a predetermined operation. The electronic component 1, the electronic component 1*a*, or the electronic component 1*b*, which functions as an oscillator, is embedded in the digital camera 1300.

As described above, the electronic component 1, the electronic component 1*a*, or the electronic component 1*b*, which has a high frequency stability, is used as the electronic apparatus, and thus it is possible to provide the electronic apparatus with a higher performance.

Meanwhile, the electronic component 1 according to the embodiment of the invention can be applied not only to the personal computer 1100 (mobile personal computer) of FIG. 4A, the mobile phone 1200 of FIG. 4B, and the digital camera 1300 of FIG. 5 but also to electronic apparatuses such as an ink jet type discharge apparatus (for example, an ink jet printer), a laptop type personal computer, a television, a video camera, a car navigation apparatus, a pager, an electronic organizer (an electronic organizer with a communication function is also included), an electronic dictionary, an electronic calculator, an electronic game machine, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, a device for a moving object communication base station, a storage area network device such as a router or a switch, a local area network device, and a transmitter for a network.

Moving Object

Subsequently, a moving object to which the electronic component 1, the electronic component 1*a*, or the electronic component 1*b* according to the embodiment of the invention is applied will be described with reference to FIG. 6.

Figure 6:
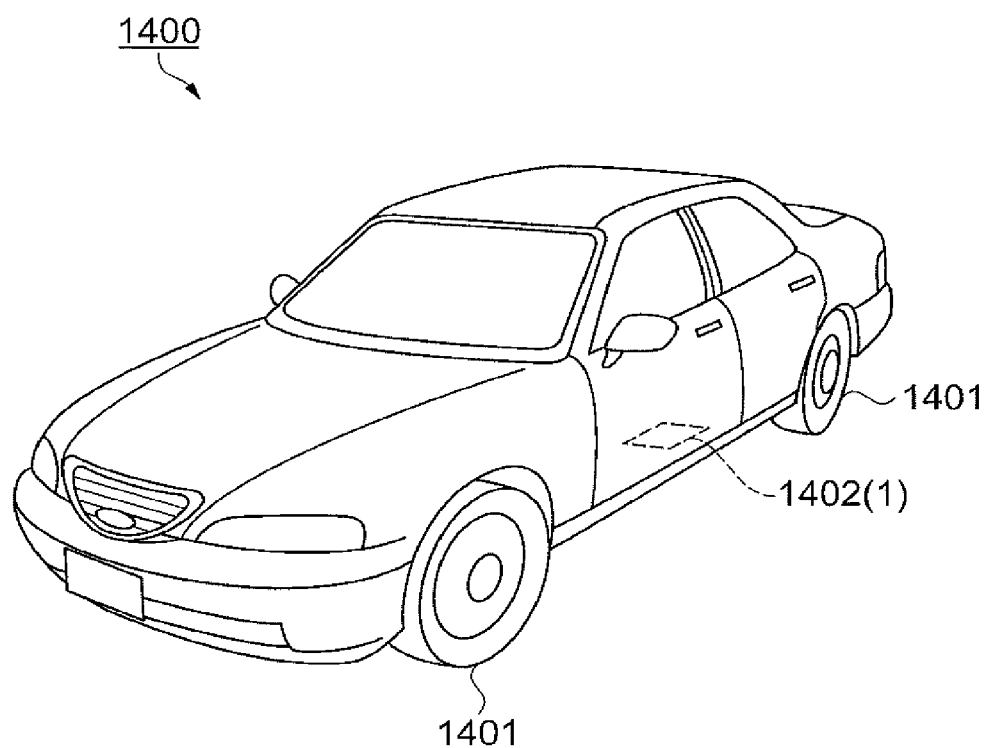
FIG. 6 is a perspective view showing the configuration of a vehicle as a moving object including the electronic component according to the invention.

FIG. 6 is a perspective view showing the configuration of a vehicle 1400 as a moving object including the electronic component 1, the electronic component 1*a*, or the electronic component 1*b* according to the embodiment of the invention.

A gyro sensor configured to include the electronic component 1, the electronic component 1*a*, or the electronic component 1*b* according to the invention is mounted in the vehicle 1400. For example, as shown in FIG. 6, an electronic control unit 1402 having the gyro sensor, controlling a tire 1401 and the like, embedded therein is mounted in the vehicle 1400 as a moving object. In addition, as other examples, the electronic component 1 can be widely applied to an electronic control unit (ECU), such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric vehicle, and a vehicle body position control system.

As described above, the electronic component 1, the electronic component 1*a*, or the electronic component 1*b*, which has a high frequency stability, is used as the moving object, and thus it is possible to provide the moving object with a higher performance.

While the electronic components 1, 1*a*, and 1*b*, the electronic apparatus, and the moving object according to the invention have been described with reference to the illustrated embodiments, the invention is not limited thereto, and the configuration of each portion may be replaced with an arbitrary configuration having the same function. In addition, other arbitrary structures may be added to the invention. In addition, the embodiments described above may be appropriately combined.

The entire disclosure of Japanese Patent Application No. 2013-265011, filed Dec. 24, 2013 is expressly incorporated by reference herein.

What is claimed is:

1. An electronic component comprising:
    a case;
    a first terminal comprising a first portion provided outside of the case; and
    a second terminal that is configured to use for adjustment or inspection of the electronic component and comprises a second portion provided outside the case and shorter than the first portion, the shorter second portion provided in such a manner to thereby reduce radiation of heat to an outside of the case.

2. The electronic component according to claim 1, further comprising a memory provided inside the case and connected to the second terminal.

3. The electronic component according to claim 2, wherein the second terminal is configured to supply data to the memory.

4. The electronic component according to claim 3, further comprising a control circuit,
    wherein the data is used to adjust the control circuit.

5. The electronic component according to claim 4, further comprising at least one of a heater and an oscillation circuit,
    wherein the control circuit is configured to control the at least one of the heater and the oscillation circuit.

6. The electronic component according to claim 1, further comprising a control circuit,
    wherein the second terminal is configured to use for inspection of the control circuit.

7. The electronic component according to claim 6, further comprising a memory,
    wherein the control circuit is configured to output data from the memory.

8. The electronic component according to claim 1,
    wherein when viewed from the direction parallel to the first terminal, the case has a corner, and the first terminal is closer to the corner than the second terminal is.

9. An electronic apparatus comprising;
    the electronic component according to claim 1; and
    a substrate;
    wherein the first portion is connected to the substrate, and
    wherein the second portion is separated from the substrate by a gap.

10. An electronic component comprising:
    a case;
    a memory provided inside the case;
    a first lead terminal comprising a first portion provided outside of the case; and
    a second lead terminal connected to the memory and comprising a second portion provided outside the case and shorter than the first portion, the shorter second portion provided in such a manner to thereby reduce radiation of heat to an outside of the case,
    wherein the second lead terminal is configured to supply data to the memory.

11. The electronic component according to claim 10, further comprising a control circuit,
    wherein the data is used to adjust the control circuit.

12. The electronic component according to claim 11, further comprising at least one of a heater and an oscillation circuit, wherein the control circuit is configured to control the at least one of the heater and the oscillation circuit.

13. The electronic component according to claim 10, wherein when viewed from the direction parallel to the first lead terminal, the case has a corner, and the first lead terminal is closer to the corner than the second lead terminal is.

14. An oscillator comprising:
a case;
a resonator element provided inside the case;
a heater provided inside the case;
first straight pin that penetrates the case; and
a second straight pin that penetrates the case and shorter than the first straight pin, the shorter second straight pin provided in such a manner to thereby reduce radiation of heat to an outside of the case.

15. The electronic component according to claim 14, further comprising a first substrate provided inside the case,
wherein a first part of the first straight pin is connected to the first substrate, and
wherein a first part of the second straight pin is connected to the first substrate.

16. The electronic component according to claim 15,
wherein a second part of the first straight pin is provided outside of the case and is configured to be connected to second substrate, and
wherein a second part of the second straight pin is provided outside of the case and is configured to be separated from the substrate by a gap.

17. The electronic component according to claim 14,
wherein when viewed from a direction parallel to the first straight pin, the case has a corner, and the first straight pin is closer to the corner than the second pin is.

18. The electronic component according to claim 14, wherein when viewed from a direction parallel to the first straight pin, the case has one square corner and three round corners, and the first straight pin is closer to the square corner than the second straight pin is.

19. The electronic component according to claim 18, further comprising a protrusion provided on the exterior surface of the case,
wherein when viewed from the direction, the first straight pin is closer to the square corner than the protrusion is.

20. The electronic component according to claim 19, wherein when viewed from the direction, the protrusion is closer to the square corner than to the second straight pin.

* * * * *